US012580031B2

(12) United States Patent
Lien et al.

(10) Patent No.: US 12,580,031 B2
(45) Date of Patent: Mar. 17, 2026

(54) LEVEL-BASED DATA REFRESH IN A MEMORY SUB-SYSTEM

(71) Applicant: Micron Technology, Inc., Boise, ID (US)

(72) Inventors: Yu-Chung Lien, San Jose, CA (US); Huai-Yuan Tseng, San Ramon, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 18/662,945

(22) Filed: May 13, 2024

(65) Prior Publication Data

US 2024/0386974 A1 Nov. 21, 2024

Related U.S. Application Data

(60) Provisional application No. 63/466,971, filed on May 16, 2023.

(51) Int. Cl.
*G11C 16/34* (2006.01)
*G11C 16/10* (2006.01)
*G11C 29/52* (2006.01)

(52) U.S. Cl.
CPC ........ *G11C 16/3459* (2013.01); *G11C 16/102* (2013.01); *G11C 29/52* (2013.01)

(58) Field of Classification Search
CPC ... G11C 16/3459; G11C 16/102; G11C 16/10; G11C 16/3418; G11C 29/52; G11C 29/42; G11C 2029/0409; G11C 2029/0411; G11C 11/5628
See application file for complete search history.

(56) References Cited

FOREIGN PATENT DOCUMENTS

CN 111752854 A * 10/2020 ........... G06F 3/0619

* cited by examiner

*Primary Examiner* — Sultana Begum
(74) *Attorney, Agent, or Firm* — Lowenstein Sandler LLP

(57) ABSTRACT

A system can include a memory device and a processing device, operatively coupled with the memory device, to perform operations including writing data to an MU of the memory device and performing one or more scan operations on the MU to determine an aggregate value of a data state metric reflective of an amount of erroneous memory cells in the MU. The operations can include determining whether a value of the data state metric reflective of a specified set of erroneous memory cells in the MU satisfies a criterion and identifying a target programming level to which at least one erroneous memory cell was originally programmed. They can also include reprogramming the at least one erroneous memory cell to the target programming level.

20 Claims, 6 Drawing Sheets

100

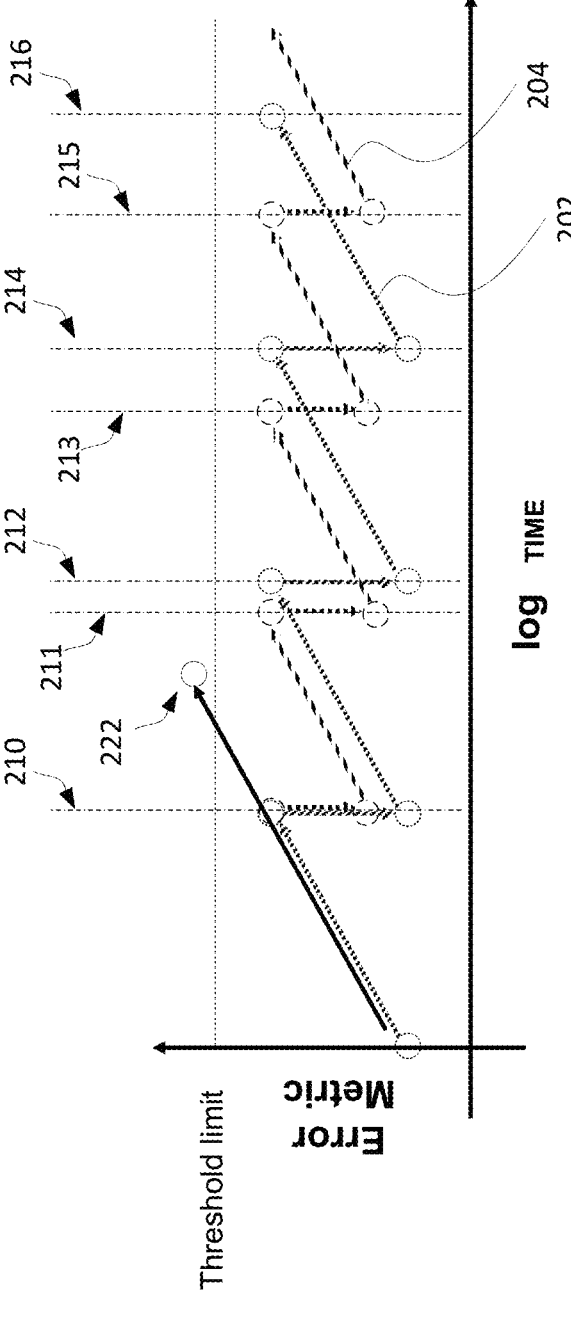
FIG. 2

300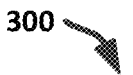

Writing data to an MU of a memory device by respectively programming each cell of the MU to a corresponding programming level, each programming level associated with a respective programming level page of a plurality of programming level pages, wherein each programming level page includes a set of programming levels 320

Performing one or more scan operations on the MU to determine an aggregate value of a data state metric reflective of an amount of erroneous memory cells in the MU 322

Responsive to the aggregate value exceeding a predetermined threshold value, determining whether a value of the data state metric reflective of a specified set of erroneous memory cells in the MU satisfies a criterion 324

Responsive to determining that the value of the data state metric satisfies the criterion, identifying, a target programming level to which at least one erroneous memory cell was originally programmed 326

Reprogramming, using parity data, the erroneous memory cells to the target programming level 328

FIG. 3

400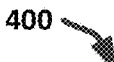

Writing data to an MU of a memory device by respectively programming each cell of the MU to a corresponding programming level, each programming level associated with a respective programming level page of a plurality of programming level pages, wherein each programming level page includes a set of programming levels 420

Performing one or more scan operations on the MU to determine an aggregate value of a data state metric reflective of an amount of erroneous memory cells in the MU 422

NO

Does the aggregate value of the data metric exceed a predetermined threshold value? 423

YES

Responsive to the aggregate value exceeding a predetermined threshold value, determining whether a value of the data state metric reflective of a specified set of erroneous memory cells in the MU satisfies a criterion 424

Responsive to determining that the value of the data state metric satisfies the criterion, identifying, a target programming level to which at least one erroneous memory cell was originally programmed 426

Determining a check point counter value incremented by performing the one or more scan operations 461

Identifying, in a table on the memory device, the target programming level associated with the check point counter value 463

Determining a programming level to which a largest amount of erroneous memory cells were originally programmed 462

Reprogramming, using parity data, the at least one erroneous memory cell to the target programming level 428

Verifying that the at least one memory cell is successfully programmed to the target programming level 429

FIG. 4

500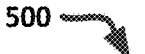

Writing data, to a memory device that includes an array of memory cells arranged into one or more management units (MUs), by respectively programming each cell of the MU to a corresponding programming level, each programming level associated with a respective programming level page of a plurality of programming level pages, wherein each programming level page includes a set of programming levels 520

Performing one or more scan operations on the memory cells of the MU to determine an aggregate bit error count value 524

Determining whether the aggregate bit error count value satisfies a first criterion 526

Responsive to determining that the aggregate bit error count value satisfies the criterion, determining a bit error count value reflective of the memory cells of the MU that are programmed to one of the programming levels within a predetermined programming level page 528

Determining whether the bit error count value satisfies a second criterion 532

Responsive to determining that the bit error count value satisfies the second criterion, identifying a target programming level to which a largest group of erroneous memory cells in the MU were originally programmed 534

Reprogramming, using parity data, the largest group of erroneous memory cells to the target programming level 536

Verifying that all of the memory cells of the largest group are successfully programmed to the target programming level 537

FIG. 5

LEVEL-BASED DATA REFRESH IN A MEMORY SUB-SYSTEM

RELATED APPLICATIONS

This application claims the benefit of U.S. Provisional Patent Application No. 63/466,971, filed May 16, 2023, the entire contents of which are hereby incorporated by reference herein.

TECHNICAL FIELD

Embodiments of the disclosure relate generally to memory sub-systems, and more specifically, relate to level-based data refresh in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 is a graph of an error metric relative to a logarithmic time scale depicting occurrences of data refresh operation on a memory device in accordance with some embodiments of the present disclosure;

FIG. 3 is a flow diagram of an example method for performing level-based data refresh management on a memory device in accordance with some embodiments of the present disclosure;

FIG. 4 is a flow diagram of an example method for performing level-based data refresh management on a memory device in accordance with some embodiments of the present disclosure;

FIG. 5 is a flow diagram of an example method for performing level-based data refresh management on a memory device in accordance with some embodiments of the present disclosure.

DETAILED DESCRIPTION

Figure 1:
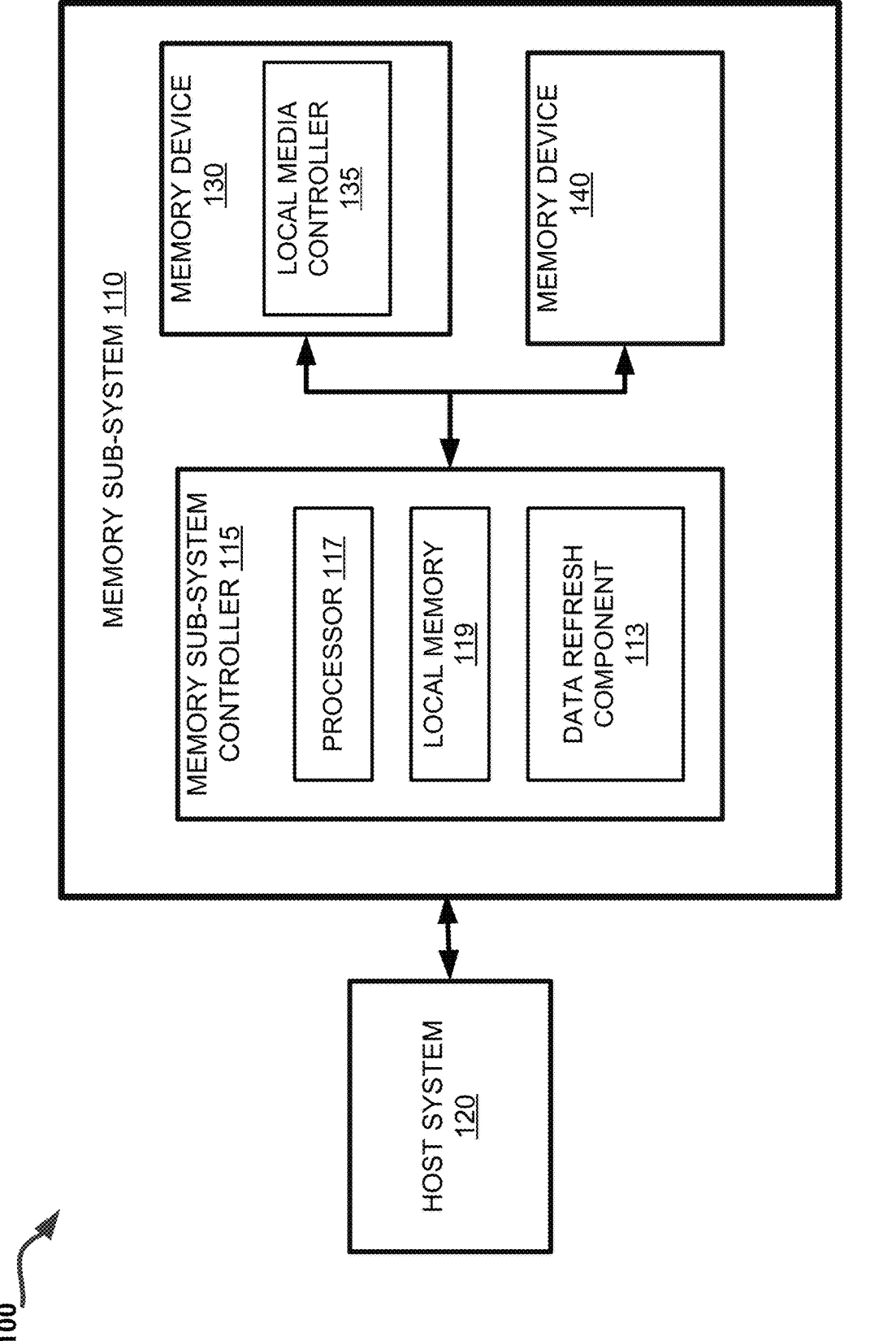
FIG. 1 illustrates an example computing system that includes a memory sub-system in accordance with some embodiments of the present disclosure.

Aspects of the present disclosure are directed to level-based refresh of data in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1. A non-volatile memory device is a package of one or more dies. Each die can include of one or more planes. For some types of non-volatile memory devices (e.g., NAND devices), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include cells arranged in a two-dimensional or three-dimensional grid. Memory cells can be formed on a silicon wafer in an array of columns connected by conductive lines (also hereinafter referred to as strings, bitlines, or BLs) and rows connected by conductive lines (also hereinafter referred to as wordlines or WLs). A word-line can refer to a conductive line that connects control gates of a set (e.g., one or more rows) of memory cells of a memory device that are used with one or more bitlines to generate the address of each of the memory cells. In some embodiments, each plane can carry an array of memory cells formed onto a silicon wafer and joined by conductive BLs and WLs, such that a wordline joins multiple memory cells forming a row of the array of memory cells, while a bitline joins multiple memory cells forming a column of the array of memory cells. The intersection of a bitline and wordline constitutes the address of the memory cell. A block hereinafter refers to a unit of the memory device used to store data and can include a group of memory cells, a wordline group, a wordline, or individual memory cells addressable by one or more wordlines. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. For ease of description, these circuits can be referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

In a memory device, a cell can be programmed (i.e., written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (i.e., having a charge Q stored thereon) there can be a threshold control gate voltage $V_t$ (also referred to as the "threshold voltage") such that the source-drain electric current is low for the control gate voltage ($V_{CG}$) being below the threshold voltage, $V_{CG}<V_t$. The current increases substantially once the control gate voltage has exceeded the threshold voltage, $V_{CG}>V_t$. Because the actual geometry of the electrodes and gates varies from cell to cell, the threshold voltages can be different even for cells implemented on the same die. The cells can, therefore, be characterized by a distribution P of the threshold voltages, $P(Q, V_t)=dW/dV_t$, where dW represents the probability that any given cell has its threshold voltage within the interval $[V_t, V_t+dV_t]$ when charge Q is placed on the cell.

A programming operation can be performed by applying a series of incrementally increasing programming voltage pulses to the control gate of a memory cell being programmed. When the applied voltage reaches the threshold voltage of the memory cell, the memory cell turns on and sense circuitry detects a current on a bit line coupled to the memory cell. The detected current activates the sense circuitry which can determine whether the present threshold voltage is greater than or equal to the target threshold voltage. If the present threshold voltage is greater than or equal to the target threshold voltage, further programming is not needed. Otherwise, programming continues in this manner with the application of additional program pulses to the memory cell until the target $V_t$ and data state is achieved.

Precisely controlling the amount of the electric charge stored by the cell allows multiple logical levels to be distinguished, thus effectively allowing a single memory cell to store multiple bits of information. One type of cell is a single level cell (SLC), which stores 1 bit per cell and defines 2 logical states ("states") ("1" or "L0" and "0" or "L1") each corresponding to a respective $V_t$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_t$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_t$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCS, PLCs, etc. or any combination of such. For example, a memory device can include an SLC portion, and an MLC portion, a TLC portion, a QLC portion, or a PLC portion of cells.

A valley margin can also be referred to as a read window (i.e., a size measured in volts, representing the distance, on a voltage scale, between a Vt distribution associated with one programming level and a Vt distribution associated with a subsequent programming level). For example, in a SLC cell, there is one read window that exists with respect to the two Vt distributions. Analogously, in an MLC cell, there are three read windows that exist with respect to the four Vt distributions. Similarly, in a TLC cell, there are seven read windows that exist with respect to the eight Vt distributions.

Analogously, in a QLC cell, there are fifteen read windows that exist with respect to the sixteen Vt distributions. Read window size generally decreases as the number of states increases. For example, the one read window for the SLC cell may be larger than each of the three read windows for the MLC cell, and each of the three read windows for the MLC cell may be larger than each of the seven read windows for the TLC cell, etc. Read window budget (RWB) refers to the cumulative value of the read windows (i.e., the total size of all the read windows of a set of memory cells).

A memory cell can be read by applying a ramped voltage to the control gate of the memory cell. If the applied voltage is equal to or greater than the threshold voltage of the memory cell, the memory cell turns on and sense circuitry can detect a current on a bit line coupled to the memory cell. The detected current activates the sense circuitry determines the present threshold voltage of the cell. Accordingly, certain non-volatile memory devices can use a demarcation voltage (i.e., a read reference voltage) to read data stored at memory cells. For example, when a read reference voltage (also referred to herein as a "read voltage") is applied to the memory cells, if a $V_t$ of a specified memory cell is identified as being below the read reference voltage that is applied to the specified memory cell, then the data stored at the specified memory cell can be read as a particular value (e.g., a logical '1') or determined to be in a particular state (e.g., a set state). If the $V_t$ of the specified memory cell is identified as being above the read reference voltage, then the data stored at the specified memory cell can be read as another value (e.g., a logical '0') or determined to be in another state (e.g., a reset state). Thus, the read reference voltage can be applied to memory cells to determine values stored at the memory cells. Such threshold voltages can be within a range of threshold voltages or reflect a normal distribution of threshold voltages.

In some memory sub-systems, a read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory, one or more portions where the sub-blocks are configured as multi-level cell (MLC) memory that can store two bits of information per cell, (triple-level cell) TLC memory that can store three bits of information per cell, and/or one or more portions where the sub-blocks are configured as quad-level cell (QLC) memory that can store four bits per cell. The voltage levels of the memory cells in TLC memory form a set of 8 programming distributions representing the 8 different combinations of the three bits stored in each memory cell. Depending on how the memory cells are configured, each physical memory page in one of the sub-blocks can include multiple page types. For example, a physical memory page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical memory page formed from memory cells of the QLC memory type can have a total of four logical pages, where each logical page can store data distinct from the data stored in the other logical pages associated with that physical memory page, which is herein referred to as a "page."

In certain multi-plane memory devices such as memory devices with memory cells arranged in an array ("a memory array") of wordlines and bitlines, there can be a one-to-one correspondence between a memory array associated with each plane and other related circuitry, such as for example, an independent plane driver circuit, with bitline bias circuitry, a sense amplifier, and a number of registers. In some cases, the independent plane driver circuits allow for parallel and concurrent memory access operations to be performed on the respective memory arrays of each plane of the multi-plane memory device. In devices capable of such parallelism, the logical address space mapped to physical locations on the memory device can include multiple management units (MUs), such that, as explained in more detail below, each MU can include one or more data-storing elements. Each of these data-storing elements, such as cells (e.g., connected within an array of WLs and BLs), pages, blocks, planes, dies, and combinations of one or more of the foregoing elements, can be referred to as "data-storage units". For the purposes of this disclosure, in the context of two data-storage units, the data-storage unit that can include or subsume the other data-storage unit can be referred to as the "higher-order data-storage unit". Similarly, in the same context, a data-storage unit that can be included in or subsumed by the other data-storage unit can be referred to as the "lower-order data-storage unit". In some examples, an MU can be an addressable data-storage unit that includes a predefined number of smaller addressable data-storage units of an order that is lower than the MU.

Memory devices can be manufactured with certain imperfections and can develop defects in their components over time. In many circumstances, memory devices face challenges in terms of wear and degradation, primarily caused by repeated program/erase (P/E) cycles, which can often affect the device's performance, reliability, and lifespan. Various factors and physical phenomena can contribute to this wear and degradation. For example, since memory cells in memory devices are spaced very close together, they can experience a phenomenon called Inter-cell Interference (ICI), or cell-to-cell (C2C) coupling, where the electrical activity in one cell can affect the neighboring cells, resulting in undesirable voltage level shifts and interference. Furthermore, due to the repeated P/E cycles, groups of memory cells can experience shifts in their $V_t$ distributions as the threshold voltage of memory cells changes over time, leading to overlapping and less distinguishable voltage levels that represent stored data. Repeated P/E cycles can also result in charge trapping within the memory cells' insulating layers, causing erratic behavior, and further contributing to $V_t$ shifts. This can occur due to the electric fields generated by the charged cells, which can cause a transfer of charge to adjacent cells. This unintentional transfer of charge can lead to data corruption or loss, reducing the reliability of the memory and the data retention rates of the memory device. Lateral charge loss (LCL) is another phenomenon that can occur in NAND flash memory. It refers to the phenomenon where the charge stored in one memory cell can unintentionally leak into a neighboring cell due to the close proximity of the cells and the stored electron density between the cells or wordlines. This can occur due to data retention stress when data is stored at cells for extended periods of time leading to a loss of charge and potential data corruption or loss.

Accordingly, over time and under various environmental and operating conditions, these and other phenomena can affect the components of the memory device leading to data loss and degradation in data retention capabilities. For example, an MU or a lower-order data-storage unit can become defective such that the memory device cannot reliably read data from the component. These phenomena collectively impact the RWB, which can be a key metric evaluating memory device performance. For example, when some of these effects are considered for a set of multiple cells in one or more memory arrays on a memory device, these phenomena can result in a lowering and widening of the $V_t$ distribution for any programmed state and therefore impair the ability to accurately read the cells. The $V_t$ distribution widening can, in turn, cause RWB degradation and negatively affect memory device reliability. For example, RWB degradation can lead to an increase in the number of errors (e.g., an amount bit errors expressed as a bit error count (BEC)) and/or an increase in the error rate (e.g., bit error rate (BER)). Thus, a reduced RWB is associated with higher BECs, BERs, degraded data retention, and lower device longevity.

In many systems the effects of some or all of the aforementioned phenomena can cause the RWB to decrease logarithmically with time (after data is initially written to the memory device) and increase the occurrence of errors (e.g., increase the BEC) to the point until the user data cannot be reliably read back. In these cases, error correction techniques and redundancy data can be used to address the accumulation of errors and degradation of the user data. These techniques can include implementing advanced error correction codes (ECC) such as Low-Density Parity-Check (LDPC) codes, as described in more detail below, and performing an In-Field Touch-Up (IFTU) on the areas of the memory device exhibiting errors to mitigate the impact of these phenomena. IFTU refers to a technique used to correct errors in memory devices by applying additional programming cycles to specific memory cells that have experienced errors to accurately restore their programmed state. IFTU can be used to bring a memory cell or an MU of a memory device back into its originally programmed state and to reduce the BEC as well as to recover the RWB that has been lost since the time that the data was originally programmed in that memory cell or MU. For the purposes of this disclosure, an IFTU can be referred to as a data refresh operation and as an error correction operation.

ECC refers to a technique that can be used to detect and correct errors that may occur during the storage or retrieval of data from the memory. In some systems, ECC works by adding redundant information (e.g., redundancy data, error correction data, parity data) to the data before it is stored in the memory. This redundant error correction information can be calculated using a mathematical algorithm that generates parity bits, which are added to the data. When the data is read back from the memory, the parity bits are used to detect any errors that may have occurred during storage or retrieval. If errors are detected, the ECC algorithm can use the redundant error correction information to correct the errors and recover the original data.

The ECC algorithm can be implemented using various codes, such as Hamming code, Reed-Solomon code, or Low-Density Parity-Check (LDPC) code. These codes have different characteristics in terms of error detection and correction capabilities, as well as complexity and overhead. For example, LDPC codes are a class of error-correction codes that implement parity-check matrix that is used to add redundancy to the data and can be used as an alternative to the parity bits used by ECC. Like ECC, LDPC codes also add redundant data to the original data, but they use a different method for detecting and correcting errors.

Whether in the context of ECC or LDPC, a code rate refers to a measure of the amount of error correction data added to the original data compared to the total amount of data, including both original data and error-correction bits. The code rate (CR) can be expressed as a ratio $$CR = \frac{(\text{amount of host data on } MU)}{(\text{amount of host data on } MU + \text{amount of error correction data on } MU)},$$

such as ½, ⅔, or ¾. A lower code rate is indicative of more redundancy being added, which increases the ability to detect and correct errors, but also increases the amount of data that needs to be transmitted or stored. Accordingly in the context of code rates being compared, a lower code rate would be representative of a larger proportion of redundancy/parity/error-correction data being added relative to the host data, while a higher code rate would be representative of a smaller proportion of redundancy/parity/error-correction data being added relative to the host data.

These techniques can be used to perform IFTUs by using the parity data to perform data refresh operations periodically on the memory device. For example, with a predetermined frequency or in response to a triggering event, an IFTU operation can be performed to refresh the data of an MU using the parity data to detect and correct errors in the data stored in the MU. These recurrent data refresh operations can bring most if not all the memory cells (i.e., the values reflected by the programming states of the memory cells) back to their target programming level so that the data of the MU accurately reflects its originally programmed state.

However, data refresh operations can consume significant computing and energy resources as well as time. Performing IFTUs on an MU makes that MU temporarily unavailable for other purposes and reduces the resources of the memory device available for other operations. Consequently, until the IFTU is complete, the MU is not accessible for other operations and the resources being consumed by the data refresh operations of the IFTU reduce the bandwidth and increase latency of the memory device and reduce its overall performance. This is generally due to the IFTU operations being performed on memory cells without regard to the programming level page to which their target programming level belongs to. Because the occurrence of errors and the increase of error counts or error rates with time is not evenly distributed across the various programming levels to which the memory cells can be programmed to, some programming level pages can accumulate more errors than other programming level pages and can accumulate errors faster than other programming level pages. Accordingly, performing IFTU on an MU can entail refreshing the data in memory cells of an MU whose programming levels are within programming level pages that do not have many or any errors. Thus computing resources, energy, and time is wasted refreshing data that may not need to be refreshed.

Aspects of the present disclosure address the above and other deficiencies by performing data refresh operations on a per-programming-level basis to reduce the computing resources consumed and reduce the duration of the data refresh operation. In some embodiments, a read operation can be performed on an MU and a data state metric (e.g., a raw bit error rate (RBER) or BEC) can be determined for the MU being read. Upon determining that the data state metric value exceeds a pre-determined threshold value, the various programming level pages can be investigated to determine whether some of them are contributing more than others to cause the data state metric to exceed the threshold value. Thus, if the data state metric value attributable to memory cells whose programming level is within a specified programming level page (e.g., a lower page (LP) of a QLC) exceeds a different threshold value, the block on which the MU is located can be folded without a data refresh operation being performed on the MU. If the data state metric value attributable to those memory cells (i.e., the cells whose programming level is within the specified programming level page (e.g., a lower page (LP) of a QLC)) does not exceed that threshold value, the remaining programming levels can be investigated to determine the programming levels to which the cells exhibiting erroneous programming states are programmed (i.e., to determine the programming levels that are contributing to the data state metric exceeding the first threshold value). In this process, the specific cells exhibiting erroneous states (i.e., states that differ from those to which they were originally programmed (as determined by reference to parity data) as well as the target programming levels to which they were originally programmed can be determined. Then, the parity data can be used to refresh (i.e., reprogram) those cells within their particular programming levels without refreshing the cells that were programmed to other programming levels (i.e., forego refreshing the data of the cells of programming levels that do not have cells exhibiting erroneous states or programming levels whose contribution to causing the data state metric value to exceed the threshold value is substantially less significant than the contribution of one or more other programming levels). The reprogrammed cells can then undergo a verification operation to verify that the reprogrammed cells were programmed correctly to reflect their original programming state. This process can be repeated multiple times with memory cells programmed to different programming levels being refreshed each time a data refresh operation is performed on a particular MU.

Advantages of the present disclosure include having a memory sub-system that takes less time and energy to perform each IFTU (i.e., each instance of set of data refresh operations). In the various embodiments disclosed herein, for a given MU of a memory device, by performing data refresh selectively on the memory cells programmed to some of the programming levels and not on the memory cells programmed to other programming levels, the duration of each data refresh cycle (i.e., each IFTU operation) performed on that MU is significantly reduced. Accordingly, each data refresh cycle consumes less energy and computing resources to complete. Thus since every IFTU operation is performed selectively on a subset of some of the programming levels, even with more frequent IFTU operations being performed overall, the total duration, computing resources consumed, and energy consumed is decreased relative to systems where the IFTU operations are performed on all programming levels of an MU. Consequently, these embodiments facilitate the maintenance of a high level of data reliability and integrity, while reducing resource consumption, latency, and other quality of service metrics of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such devices.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dies and/or channels to form management units (MUs). In some embodiments, an MU can refer to a memory cell, a set of cells connected to a wordline, a page, a block, or a combination of one or more of the foregoing. An MU can refer to set of one or more individual data-storage units of the memory device 130 that can be written or erased in a single operation. For example, memory device 130 can be divided into multiple MUs, where each MU includes one or more blocks. An MU containing a predefined total number of usable blocks where each block is located on a different plane of a memory device 130 can be referred to as a super block.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a data refresh component (DRC) 113 that can perform data access and management operations on the memory device 130. In some embodiments, the DRC 113 can read data from and write data to the memory device 130. For example, DRC 113 can perform error correction operations on user data and on error-correction data with a varying frequency over a duration of a period of time to refresh. In some embodiments, the memory sub-system controller 115 includes at least a portion of the data refresh component 113. In some embodiments, the data refresh component 113 is part of the host system 120, an application, or an operating system. In other embodiments, local media controller 135 includes at least a portion of data refresh component 113 and is configured to perform the functionality described herein.

The DRC 113 can, in some embodiments, operate in conjunction with the memory device 130 that can have the following hierarchy of components: the memory device can contain one or more dies; each die can have one or more planes; each plane can include one or more blocks; each block can contain pages of memory cells arranged into arrays of intersecting wordlines and bitlines. As noted, in several embodiments, multiple lower-order data-storage units (e.g., cells) can be grouped together to form higher-order data storage units (e.g., pages) on the memory device 130. For example, blocks on the memory device 130 can be grouped together into super blocks. The present disclosure may highlight some embodiments where the higher-order data-storage units (i.e., $Unit_1$) are represented by pages (i.e., MUs) that are formed from respective groups of lower-order data-storage (i.e., $Unit_2$) that are represented by memory cells (i.e., embodiments where relationships between higher-order data-storage units and lower-order data-storage units are represented by the relationships between memory cells and pages). In other embodiments, analogous relationships are contemplated with respect other $Unit_1$:$Unit_2$ pairs in the hierarchy (i.e., relationships between $Unit_1$:$Unit_2$ pairs such as die:plane, die:block, dies:page, die:cell array, die:cell, super block:block, super block:page, super block:cell array, super block:cell, block:page, block:cell array, block:cell, plane:block, plane:page, plane:cell array, plane:cell, block: page, block:cell array, block:cell, page:half-page, page:cell array, page:cell, block:wordline, plane:block-and-page-combination, super block:page-and-cell-combination, die: page-and-cell-array-combination, etc.).

Accordingly, in the several embodiments, the DRC 113 can write data to one or to multiple memory devices 130, 140. For example, DRC 113 can write data, such as data received by the memory sub-system 110 from host 120 (such data referred to herein as "host data") and metadata such as redundancy, parity, and error-correction data created by the memory-sub-system 110 (such data referred to herein as "error-correction data") to the memory device 130. For the purposes of this disclosure, host data and other data created by the memory sub-system 110, other than the error-correction data, can collectively be referred to as "user data". In the memory sub-system 110, the DRC 113 can write data to the memory device 130 by storing the user data on the memory device 130 along with error-correction data (i.e., redundant duplicated portions of the system data or redundancy meta-data (e.g., parity metadata)). In some embodiments, the DRC 113 can store the error-correction data in the same location (e.g., same MU (i.e., same wordline, page, plane, block, die, etc.)) on the memory device as the user data, while in other embodiments, the DRC 113 can store user data in one location (e.g., an area on memory device 130) and store corresponding error-correction in a different location (e.g., in another area on memory device 130).

In some embodiments, the memory device 130 can include an array of memory cells arranged into one or more MUs. In the memory device 130, each memory cell in the array of memory cells can be respectively connected to a corresponding wordline of a plurality of wordlines. Accordingly, for the purposes of this description, writing data to an MU of the memory device refers to writing data to a group of memory cells that make up that MU or are connected to the conductive lines that make up that MU. For example, writing data to a wordline refers to writing data to a group of memory cells connected to that wordline.

Thus, in some embodiments, the DRC 113 can receive a set of user data from the host system 120 or from another component of the memory sub-system 110. The DRC 113 can write data to an MU of the memory device 130 by respectively programming each cell of the MU to a corre-sponding programming level. In these embodiments, each programming level of a memory call can be associated with a respective programming level page out of the multiple programming level pages where each programming level page includes a set of (one or more) programming levels to which the memory cells of the MU can be programmed.

In the various embodiments, the DRC 113 can perform one or more scan operations on the MU to determine an aggregate value of a data state metric reflective of an amount of erroneous memory cells in the MU. For example, scan operations performed on the MU can include read operations and comparisons with parity data associated with the data of the MU to determine whether errors are present and to determine the aggregate value of the data state metric. In some embodiments, one or more scan operations can be performed in response to either an expiration of a predeter-mined time period after writing the data, or in response to a detection of a raw bit error rate exceeding a threshold value. In some examples, the data state metric reflective of the amount of erroneous memory cells in the MU can be the error count (EC) caused by the presence of one or more erroneous cells of the MU.

In some embodiments, the DRC 113 can determine whether or not the aggregate value of the data state metric exceeds a predetermined threshold value (e.g., whether a bit error count (BEC) exceeds the maximum count that can be corrected by ECC code). In these or other embodiments, responsive to the aggregate value exceeding a predetermined threshold value (as determined by the DRC 113), the DRC 113 can then determine whether a value of the data state metric reflective of a specified set of erroneous memory cells in the MU satisfies a criterion. In some embodiments, the specified set of erroneous memory cells can include one or more erroneous memory cells programmed to one of the programming levels of a specified programming level page. For example, the DRC 113 can determine whether the value of the error count obtained from the memory cells pro-grammed to a programming level in the lower programming level page (i.e., lower page (LP)) satisfies the criterion. Thus, in these embodiments, the error count reflective of the specified set is the error count caused by the one or more erroneous memory cells in the specified set of memory cells. In some examples, the criterion can be satisfied by the error count reflective of the specified set of memory cells being below a predetermined threshold value. For example, the error count reflective of the memory cells programmed to a programming level in the LP can be below a predetermined error count value and thereby satisfy the criterion. Con-versely, the error count (i.e., for a the specified set of cells) exceeding the predetermined error count value can be a condition that fails to satisfy the criterion.

In some embodiments, responsive to determining that the value of the data state metric satisfies the criterion, the DRC 113 can identify a target programming level to which at least one erroneous memory cell was originally programmed. For example, the DRC 113 can identify the programming level to which the cells exhibiting erroneous programming state were originally programmed, to perform data refresh opera-tions on those cells in that programming level. In some embodiments, the DRC 113 identifying the target program-ming level can include the DRC 113 determining a check point counter value. The DRC 113 can increment the check point counter value upon performing the one or more scan operations to track the number of times the MU was scanned. In some embodiments, a respective check point counter value can be associated with a corresponding pro-gramming level in a table entry indicating programming levels whose cells are to have their data refreshed at the time that the check point counter reaches that value. In this manner, based on the check point counter value, the DRC 113 can identify, in the table on the memory device, the target programming level associated with the check point counter value so that it can subsequently perform data refresh operations on the memory cells programmed to that target programming level.

In other embodiments, identifying the target program-ming level can include the DRC 113 determining a pro-gramming level to which the largest amount of erroneous memory cells were originally programmed. For example, if the memory cells exhibiting erroneous programming states were initially programmed to various programming levels, then the programming level having a larger amount of erroneous memory cells than any other programming level can be identified by the DRC 113 as the target programming level the data of whose cells is to be refreshed. In some embodiments, programming levels that contribute the most to the total BEC can be determined by the DRC 113 performing count-of-failed-bit (CFbit) and count-of-failed-byte (CFbyte) scans on the MU. These scans can respec-tively provide a count of error bits/bytes (i.e., count of cells in the incorrect programming state) within the MU (e.g., a page) being scanned at a specified voltage level. In this manner the DRC 113 can determine the programming levels at which the most error bits occur (i.e., the programming levels from which the most cells contribute to the error count).

Consequently, the DRC 113 can reprogram, by using parity data, one or more erroneous memory cells to the target programming level. In some embodiments, reprogramming the one or more erroneous memory cells to the target programming level can include the DRC 113 verifying that the memory cells were successfully programmed to the target programming level.

In other embodiments, the DRC 113 can write data, to a memory device that includes an array of memory cells arranged into one or more MUs, by respectively programming each cell of the MU to a corresponding programming level. In these embodiments, each programming level can be associated with a respective programming level page of multiple programming level pages and each programming level page can include a set of programming levels to which the memory cells of the memory device 130 can be programmed. In some of these embodiments, the DRC 113 can perform one or more scan operations on the memory cells of the MU to determine an aggregate bit error count (BEC) value. These scan operations can, in some embodiments, be performed in response to an expiration of a predetermined time period or the execution of a certain number of read or write operations on the MU after the initial writing of the data. In other embodiments, these scan operations can be performed by the DRC 113 in response to a detection of a raw bit error rate exceeding a threshold value.

In some embodiments, the DRC 113 can determine whether the aggregate bit error count value satisfies a first criterion. In some embodiments, this first criterion can be satisfied by the aggregate bit error count value exceeding a predetermined threshold value. For example, the DRC 113 can determine that the aggregate BEC exceeds a pre-determined threshold value and thereby determine that the criterion is satisfied. Responsive to determining that the aggregate bit error count value satisfies the criterion, the DRC 113 can determine the bit error count value that is reflective of the memory cells of the MU that are programmed to one of the programming levels within a predetermined programming level page. In some embodiments, where each cell in the MU is a triple-level cell (TLC) and where the predetermined programming level page is a lower page (LP), the DRC 113, can determine the BEC value that is reflective of the memory cells in the LP (i.e., can determine the BEC attributable to the erroneous cells of the programming levels within the LP).

In these and other embodiments, the DRC 113 can determine whether the bit error count value (i.e., that is reflective of the memory cells of the MU that are programmed to one of the programming levels within a predetermined programming level page) satisfies a second criterion. For example, the second criterion can, in some embodiments, be satisfied by the bit error count value being below a predetermined threshold value. Accordingly, the DRC 113 can determine whether or not the BEC value of those memory cells is below the predetermined threshold value. If it is, the DRC 113 can determine that the BEC satisfies this second criterion.

In some embodiments, responsive to determining that the bit error count value satisfies the second criterion, The DRC 113 can identify a target programming level to which the largest group of erroneous memory cells in the MU were originally programmed. As noted, in some embodiments, the programming levels that contribute the most to the aggregate BEC can be determined by the DRC 113 performing CFbit and/or CFbyte scans on the MU. These scans can respectively provide a count of error bits/bytes (i.e., count of cells in the incorrect programming state) within the MU (e.g., a wordline, block) being scanned at a specified voltage level. In this manner the DRC 113 can determine the programming level(s) at which the largest amount of error bits occurs (i.e., the programming levels from which the most cells contribute to the aggregate error count).

Thus, having identified the target programming level to which the largest group of erroneous memory cells in the MU were originally programmed, the DRC 113 can reprogram, using parity data, the largest group of erroneous memory cells to the target programming level. In these embodiments, the DRC 113 refreshed the data of the erroneous memory cells that were originally programmed to this target programming level. In some embodiments, reprogramming the largest group of erroneous memory cells to the target programming level comprises verifying that all of the memory cells of the largest group are successfully programmed to the target programming level. These and other details with respect to the various features and aspects of the embodiments described herein are further explained with reference to FIGS. 2 and 3-6.

FIG. 2 shows a graph 200 of an error metric relative to a logarithmic time scale depicting occurrences of data refresh operation on a memory device in accordance with some embodiments of the present disclosure. As depicted, plot 202 shows the change in an error metric value (e.g., BEC) with respect to time (i.e., in log scale) as data refresh operations are periodically performed on all the memory cells of an MU irrespective of the programming level to which they have been programmed. For example, it can be seen that the plot depicts four instances of data refresh operations being performed on that plot 202, specifically at time 210, time 212, time 214, and time 216 and the decrease in the error metric resulting from those respective data refresh operations.

In comparison, plot 204 shows the change in the error metric value as data refresh operations are periodically performed selectively for a subset of the memory cells of the MU based on the programming level to which they have been programmed. For example, in the depicted embodiment, at time 210 the memory cells programmed to programming level L15 were reprogrammed (i.e., the data of those memory cells was refreshed). Subsequently, at time 211, the memory cells programmed to programming levels L13 and L14 were reprogrammed, while at time 213, the memory cells programmed to programming levels L12 and L15 were reprogrammed. Similarly, at time 215, the memory cells programmed to programming level L11 were reprogrammed.

As can be seen, the frequency of the data refresh operations is larger for plot 204 which reflects the selective programming-level-based selective data refresh management than of the present disclosure, than the frequency of the data refresh operations for plot 206. Although the data refresh operations can occur more frequently in some embodiments of the present invention, overall, each data refresh (i.e., each instance of an IFTU operation performed selectively on some-but-not-all programming levels of an MU) can be shorter in duration than one performed on all the cells of the MU. Consequently, in aggregate, despite a larger number of data refresh cycles occurring within a given amount of time, the embodiments of the present invention reduce the overall aggregate amount of time spent performing data refresh operations as well as the energy and computing resources consumed. Additional details with respect to these and other features of the embodiments of this disclosure are provided below with reference to FIGS. 3-6.

FIG. 3 is a flow diagram of an example method 300 for performing level-based data refresh management on a memory device in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the data refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In several embodiments described herein, operations of example method 300 can be performed together with or instead of operations of example methods 400 and 500 described in more detail below with reference to FIG. 4 and FIG. 5. In some embodiments, at operation 320, the processing logic can write data to an MU of a memory device by respectively programming each cell of the MU to a corresponding programming level, where each programming level is associated with a respective programming level page of a plurality of programming level pages, and where each programming level page includes a set of programming levels.

In these or other embodiments, at operation 322, the processing logic can perform one or more scan operations on the MU to determine an aggregate value of a data state metric reflective of an amount of erroneous memory cells in the MU. Having determined, at operation 322, the aggregate value of the data state metric reflective of the amount of erroneous memory cell in the MU exceeds a predetermined threshold value, the processing logic can, at operation 324, determine whether a value of the data state metric reflective of a specified set of erroneous memory cells in the MU satisfies a criterion. Responsive to determining that the value of the data state metric satisfies the criterion, the processing logic can, at operation 326, identify a target programming level to which at least one erroneous memory cell was originally programmed. Then, the processing logic can, at operation 328, reprogram, using parity data, the erroneous memory cells to the target programming level.

FIG. 4 is a flow diagram of another example method 400 for performing level-based data refresh management on a memory device in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the data refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In several embodiments described herein, operations of example method 400 can be performed together with or instead of operations of example method 300 described earlier and of example method 500 described in more detail below with reference to FIG. 5. In some embodiments, at operation 420, the processing logic can write data to an MU of a memory device by respectively programming each cell of the MU to a corresponding programming level. In these and other embodiments, each programming level can be associated with a respective programming level page of a plurality of programming level pages and each programming level page can include a set of programming levels.

In the various embodiments, the processing logic can then, at operation 422, perform one or more scan operations on the MU to determine an aggregate value of a data state metric reflective of an amount of erroneous memory cells in the MU (e.g., an aggregate BEC or BER). Then, at operation 423, the processing logic can determine whether the aggregate value of the data metric exceeds a predetermined threshold value. In several embodiments, responsive to the processing logic determining at operation 423 that the aggregate value exceeds the predetermined threshold value, the processing logic can, at operation 424, determine whether a value of the data state metric reflective of a specified set of erroneous memory cells in the MU satisfies a criterion. For example, the processing logic can determine, at operation 424, whether the BEC of the erroneous memory cells programmed to a programming level in the LP is below a threshold value and thereby satisfies the criterion. In other embodiments, the criterion can be satisfied by the BEC of the erroneous memory cells programmed to a programming level in the LP exceeding a threshold value.

In some embodiments, in response to determining, at operation 424, that the value of the data state metric satisfies the criterion, the processing logic can, at operation 426, identify a target programming level to which at least one erroneous memory cell was originally programmed. For example, responsive to determining that the BEC of the erroneous memory cells programmed to a programming level in the LP is below the threshold value, the processing logic can identify, at operation 426, a target programming level (e.g., a programming level that is not in the LP) to which at least one erroneous memory cell was originally programmed. In these or other embodiments, this can include, at operation 462, the processing logic determining a programming level to which the largest amount of erroneous memory cells were originally programmed. In other embodiments, identifying the target programming level can include the processing logic, at operation 461, determining a check point counter value that is incremented by the processing logic performing the one or more scan operations. It can further include, at operation 463 the processing logic identifying, in a table on the memory device, the target programming level associated with the check point counter value.

In some embodiments, the processing logic can, at operation 428, use the parity data to reprogram one or more of the erroneous memory cells to the target programming level. In these or other embodiments, this can include, at operation 429, the processing logic verifying that the memory cells are successfully programmed to the target programming level.

FIG. 5 is a flow diagram of an example method 500 for performing level-based data refresh management on a memory device in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the data refresh component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In several embodiments described herein, operations of example method 500 can be performed together with or instead of operations of example methods 300 and 400 described earlier with reference to FIGS. 3-4. In some embodiments, at operation 520, the processing logic can write data, to a memory device that includes an array of memory cells arranged into one or more MUs, by respectively programming each cell of the MU to a corresponding programming level where each programming level is associated with a respective programming level page of a set of multiple of programming level pages, where each programming level page includes a set of programming levels.

In the various embodiments, the processing logic can then, at operation 524, perform one or more scan operations on the memory cells of the MU to determine an aggregate bit error count value. In some embodiments, the processing logic can, at operation 526, determine whether the aggregate bit error count value satisfies a first criterion. Responsive to determining, at operation 526, that the aggregate bit error count value satisfies the criterion, the processing logic can, at operation 528, determine a bit error count value reflective of the memory cells of the MU that are programmed to one of the programming levels within a predetermined programming level page. For example, the processing logic can determine a BEC value of the memory cells of the MU that are programmed to the programming levels in the LP. Then, at operation 532, the processing logic can determine whether the bit error count value satisfies a second criterion.

Responsive to the processing logic determining, at operation 532, that the bit error count value satisfies the second criterion, the processing logic can, at operation 534, identify a target programming level to which the largest group of erroneous memory cells in the MU were originally programmed. Having identified, at operation 534, the target programming level to which the largest group of erroneous memory cells in the MU were originally programmed, the processing logic can, at operation 536, reprogram, using parity data, the largest group of erroneous memory cells to the target programming level. In some embodiments, reprogramming the memory cells at operation 536, can include the processing logic, at operation 537, verifying that all of the memory cells of the largest group are successfully programmed to the target programming level. In the various described embodiments, the processing logic can perform the operations described herein an arbitrary number of times dependent on the number of programming levels to which the erroneous memory cells were originally programmed. For each data refresh cycle (i.e., IFTU operation) the processing logic can repeat one or more of the aforementioned steps or procedures.

Figure 6:
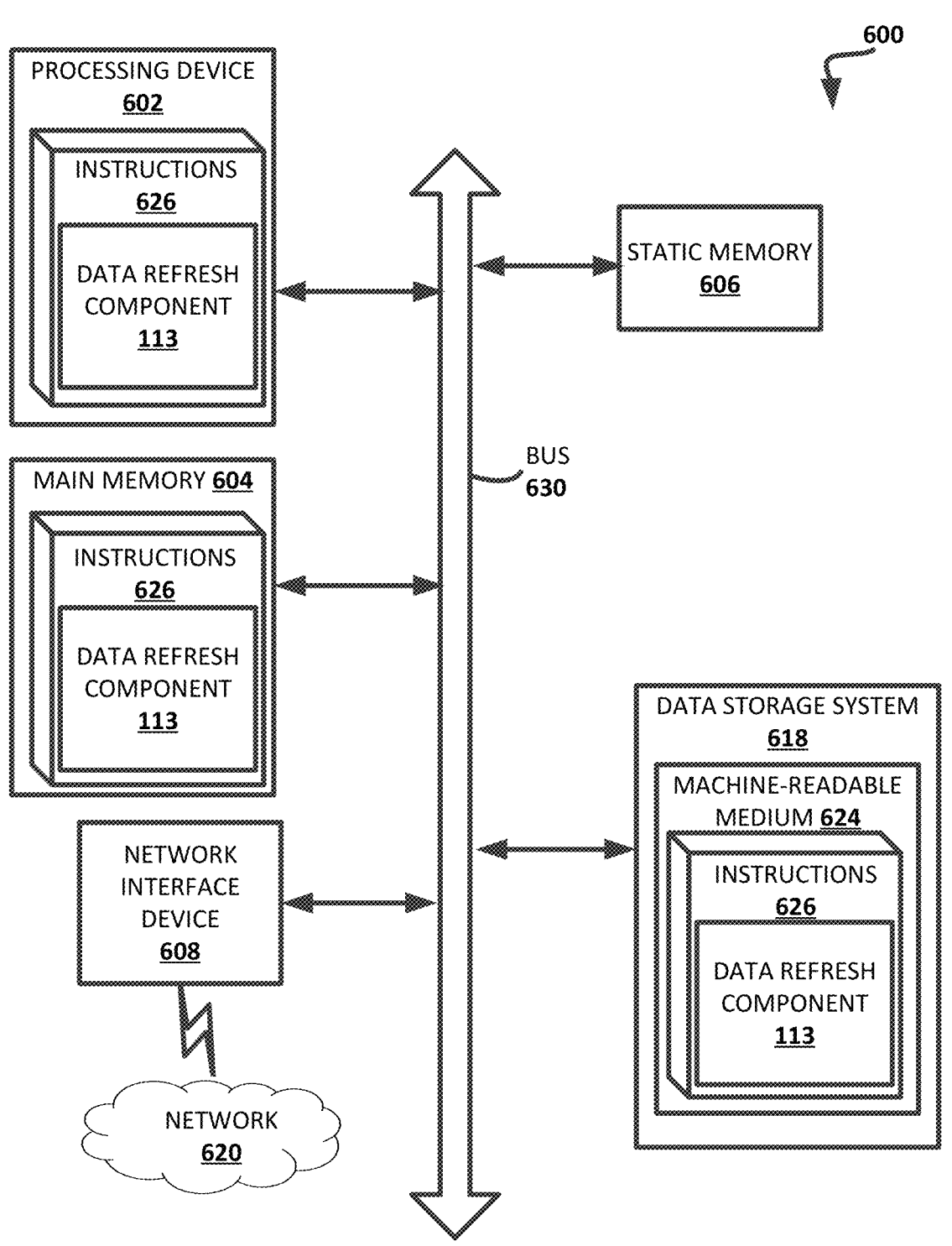
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the data refresh component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a data refresh component (e.g., the data refresh component 113 of FIG. 1). In some embodiments the instructions 626 include instructions to implement functionality corresponding to the methods described herein (e.g., the methods 300, 400, and 500, respectively of FIGS. 3-6) While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device comprising an array of memory cells arranged into one or more management units (MUs); and
   a processing device, operatively coupled with the memory device, to perform operations comprising:
      writing data to an MU of the memory device by respectively programming each memory cell of the MU to a corresponding programming level, each programming level associated with a respective programming level page of a plurality of programming level pages, wherein each programming level page comprises a set of programming levels;
      performing one or more scan operations on the MU to determine an aggregate value of a data state metric reflective of an amount of erroneous memory cells in the MU;
      responsive to the aggregate value exceeding a predetermined threshold value, determining whether a value of the data state metric reflective of a specified set of erroneous memory cells in the MU satisfies a criterion;
      responsive to determining that the value of the data state metric satisfies the criterion, identifying, a target programming level to which at least one erroneous memory cell was originally programmed; and
      reprogramming, using parity data, the at least one erroneous memory cell to the target programming level.

2. The system of claim 1, wherein reprogramming the at least one erroneous memory cell to the target programming level comprises verifying that the at least one erroneous memory cell is successfully programmed to the target programming level.

3. The system of claim 1, wherein the data state metric is an error count caused by one or more erroneous cells of the MU.

4. The system of claim 3, wherein the specified set of erroneous memory cells comprises one or more erroneous memory cells programmed to one of the programming levels of a specified programming level page, wherein the error count reflective of the specified set is the error count caused by the one or more erroneous memory cells in the specified set, and wherein the criterion is satisfied by the error count reflective of the specified set being below a predetermined threshold value.

5. The system of claim 1, wherein identifying the target programming level comprises:
   determining a check point counter value incremented by performing the one or more scan operations; and
   identifying, in a table on the memory device, the target programming level associated with the check point counter value.

6. The system of claim 1, wherein identifying the target programming level comprises:

determining a programming level to which a largest amount of erroneous memory cells were originally programmed.

7. The system of claim 1, wherein the one or more scan operations are performed in response to either an expiration of a predetermined time period after writing the data, or a detection of an error rate exceeding a threshold value.

8. A method comprising:

writing data, to a memory device comprising an array of memory cells arranged into one or more management units (MUs), by respectively programming each memory cell of the MU to a corresponding programming level, each programming level associated with a respective programming level page of a plurality of programming level pages, wherein each programming level page comprises a set of programming levels;

performing one or more scan operations on the MU to determine an aggregate value of a data state metric reflective of an amount of erroneous memory cells in the MU;

responsive to the aggregate value exceeding a predetermined threshold value, determining whether a value of the data state metric reflective of a specified set of erroneous memory cells in the MU satisfies a criterion;

responsive to determining that value of the data state metric satisfies the criterion, identifying, a target programming level to which at least one erroneous memory cell was originally programmed; and reprogramming, using parity data, the at least one erroneous memory cell to the target programming level.

9. The method of claim 8, wherein reprogramming the at least one erroneous memory cell to the target programming level comprises verifying that the at least one erroneous memory cell is successfully programmed to the target programming level.

10. The method of claim 8, wherein the data state metric is an error count caused by one or more erroneous cells of the MU.

11. The method of claim 10, wherein the specified set of erroneous memory cells comprises one or more erroneous memory cells programmed to one of the programming levels of a specified programming level page, wherein the error count reflective of the specified set is the error count caused by the one or more erroneous memory cells in the specified set, and wherein the criterion is satisfied by the error count reflective of the specified set being below a predetermined threshold value.

12. The method of claim 8, wherein identifying the target programming level comprises:

determining a check point counter value incremented by performing the one or more scan operations; and identifying, in a table on the memory device, the target programming level associated with the check point counter value.

13. The method of claim 8, wherein identifying the target programming level comprises: determining which programming level a largest amount of erroneous memory cells were originally programmed.

14. The method of claim 8, wherein the one or more scan operations are performed in response to either an expiration of a predetermined time period after writing the data, or a detection of a raw bit error rate exceeding a threshold value.

15. A non-transitory computer-readable storage medium comprising instructions that, when executed by a processing device, cause the processing device to perform operations comprising:

writing data, to a memory device comprising an array of memory cells arranged into one or more management units (MUs), by respectively programming each memory cell of the MU to a corresponding programming level, each programming level associated with a respective programming level page of a plurality of programming level pages, wherein each programming level page comprises a set of programming levels;

performing one or more scan operations on the memory cells of the MU to determine an aggregate bit error count value;

determining whether the aggregate bit error count value satisfies a first criterion;

responsive to determining that the aggregate bit error count value satisfies the criterion, determining a bit error count value reflective of the memory cells of the MU that are programmed to one of the programming levels within a predetermined programming level page;

determining whether the bit error count value satisfies a second criterion;

responsive to determining that the bit error count value satisfies the second criterion, identifying a target programming level to which a largest group of erroneous memory cells in the MU were originally programmed; and reprogramming, using parity data, the largest group of erroneous memory cells to the target programming level.

16. The non-transitory computer-readable storage medium of claim 15, wherein reprogramming the largest group of erroneous memory cells to the target programming level comprises verifying that all of the memory cells of the largest group are successfully programmed to the target programming level.

17. The non-transitory computer-readable storage medium of claim 15, wherein the first criterion is satisfied by the aggregate bit error count value exceeding a predetermined threshold value.

18. The non-transitory computer-readable storage medium of claim 15, wherein each cell in the MU is a triple-level cell and wherein the predetermined programming level page is a lower page.

19. The non-transitory computer-readable storage medium of claim 18, wherein the second criterion is satisfied by the bit error count value being below a predetermined threshold value.

20. The non-transitory computer-readable storage medium of claim 15, wherein the one or more scan operations are performed in response to either an expiration of a predetermined time period after writing the data, or a detection of a raw bit error rate exceeding a threshold value.

* * * * *